United States Patent
Mutchnik

(10) Patent No.: US 7,633,414 B1
(45) Date of Patent: Dec. 15, 2009

(54) CIRCUIT AND METHOD FOR MANCHESTER DECODING WITH AUTOMATIC LEADING PHASE DISCOVERY AND DATA STREAM CORRECTION

(75) Inventor: Sharon David Mutchnik, San Jose, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/163,717

(22) Filed: Jun. 27, 2008

(51) Int. Cl.
*H03M 5/12* (2006.01)
*H04L 27/22* (2006.01)

(52) U.S. Cl. ............... 341/70; 375/282; 375/333; 375/361

(58) Field of Classification Search ........... 341/70, 341/71, 72, 73, 74; 375/282, 333, 361; 360/42
See application file for complete search history.

(56) References Cited

U.S. PATENT DOCUMENTS

| | | | | |
|---|---|---|---|---|
| 3,491,202 A | | 1/1970 | Bailey et al. ............... 178/88 |
| 3,836,904 A | * | 9/1974 | Cross ........................ 341/70 |
| 4,603,322 A | * | 7/1986 | Blair ......................... 341/70 |
| 4,733,404 A | | 3/1988 | Ostoich ..................... 375/119 |
| 4,746,898 A | * | 5/1988 | Loeppert .................... 341/70 |
| 5,163,067 A | * | 11/1992 | Wight et al. ................ 375/333 |
| 5,224,126 A | | 6/1993 | Myers et al. ................ 375/87 |
| 5,748,123 A | * | 5/1998 | Lee ............................. 341/70 |
| 5,905,759 A | * | 5/1999 | Ishida et al. ............... 375/282 |
| 6,977,973 B1 | | 12/2005 | Wiggins ..................... 375/333 |
| 7,133,482 B2 | | 11/2006 | Poletto et al. .............. 375/361 |
| 2003/0227987 A1 | | 12/2003 | Poletto et al. .............. 375/360 |

* cited by examiner

*Primary Examiner*—Howard Williams
(74) *Attorney, Agent, or Firm*—O'Keefe, Egan, Peterman & Enders LLP

(57) ABSTRACT

A method and circuit are shown for decoding a Manchester encoded data input signal, wherein preamble found, data input, and recovered clock signals are received and a phase of the data input signal stored responsive thereto. A decision time signal alternates state responsive to the recovered clock signal. A switch pulse signal asserts when the decision time signal is active and the stored phase and current phase of the data signal have the same logic value, which is stored and cleared responsive to the recovered clock signal. A data output is decoded from a decision pair of phases responsive to the recovered clock, preamble found and decision time signals. The stored and current phases of the data input signal are selected to be the decision pair when neither the switch pulse signal or stored switch pulse signal are asserted and, otherwise, the stored phase and inverted stored phase are selected.

14 Claims, 3 Drawing Sheets

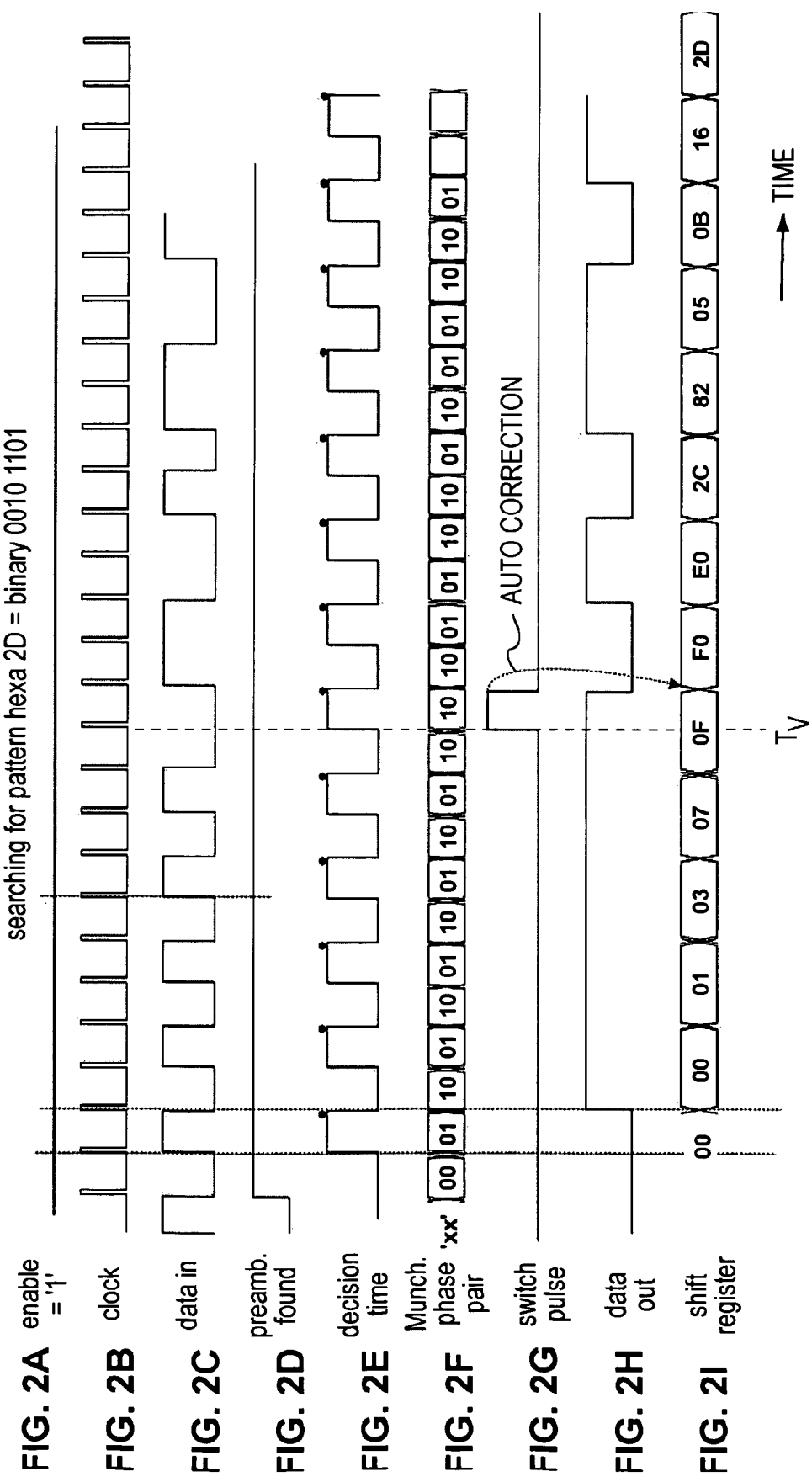

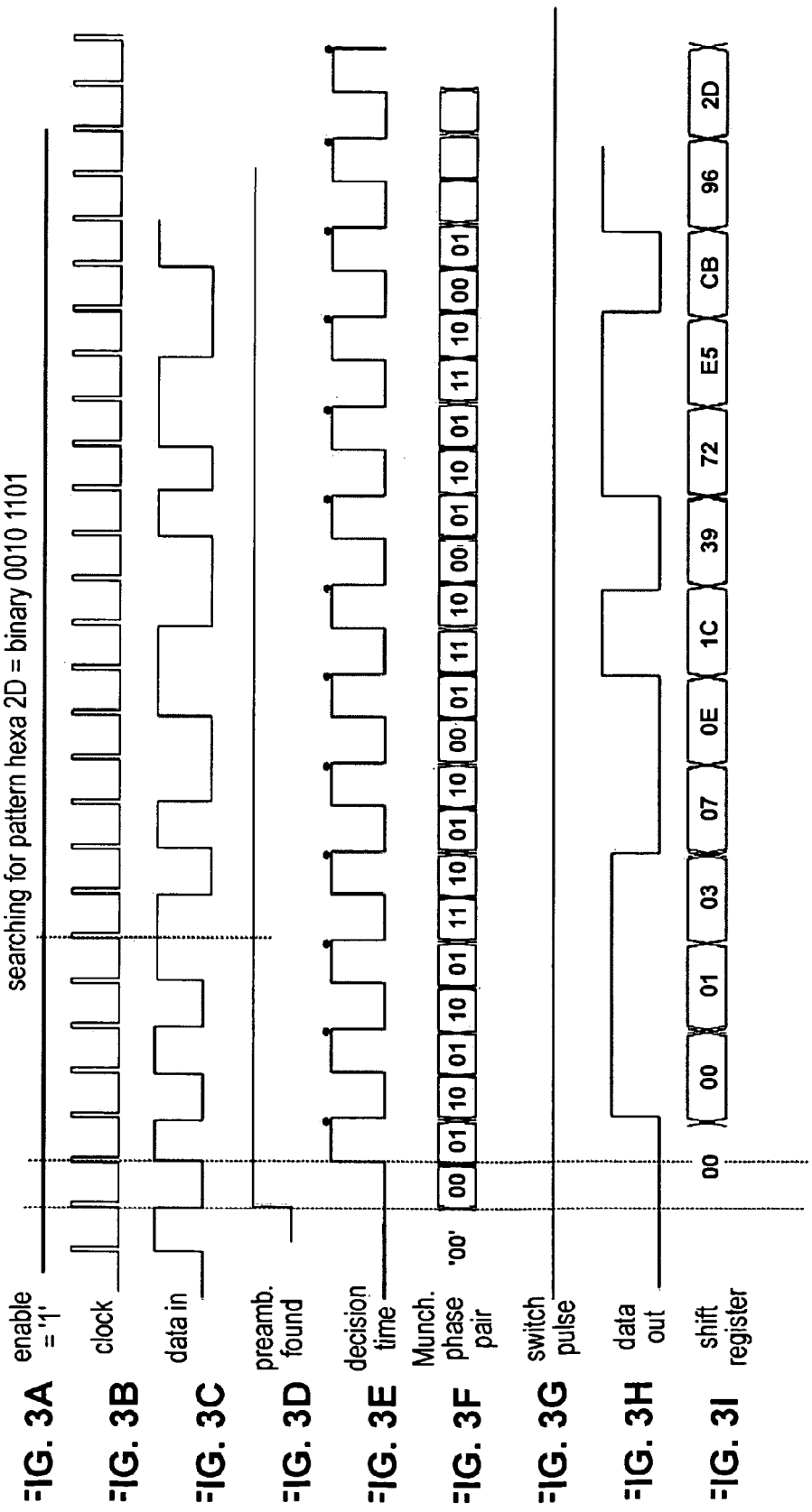

CIRCUIT AND METHOD FOR MANCHESTER DECODING WITH AUTOMATIC LEADING PHASE DISCOVERY AND DATA STREAM CORRECTION

FIELD OF THE INVENTION

This invention pertains to binary data decoding and, in particular, Manchester decoders.

BACKGROUND OF THE INVENTION

Manchester encoding relates to a technique of binary data encoding. Basically, each bit is represented by two phases equal in length, but opposite in logic value. In other words, each bit is equally divided into two phases that are opposite in sign. A binary logic '1' is commonly represented in Manchester mode by a logic low phase followed by a logic high phase, and a logic '0' is the opposite. Some encoding systems exist that consider the mirror image signal to be true, i.e. in which a logic '1' is represented by a logic high phase followed by a logic low phase, and a logic '0' the opposite. Manchester encoding has several performance advantages, including the absence of a DC signal component and the ability to recover a clock signal from the encoded data signal.

Bit stream regeneration and data recovery from a serial Manchester encoded bitstream can be difficult. In most systems, a receiver will recover the data rate clock from a preamble, which is a predefined initial pattern composed of a series of logic ones followed by logic lows. After the preamble is received, the receiver performs data recognition by looking for a Sync Word in the bitstream, which is a predefined pattern known to the receiver whose pattern and length may vary from one system to another. All data in the bitstream following the sync word is considered to be the data payload of a packet. The packet is the combination of the preamble followed by the sync word and the data payload. When data is encoded in Manchester mode, it is crucial to know where the data starts in the bitstream in order to determine the leading phase. Otherwise, Manchester to binary data decoding errors will lead to loss of synchronization and eventually packet loss.

Conventional preamble detectors and clock recovery mechanisms working on the Manchester encoded data typically cannot supply the information on the leading Manchester phase discovery. An example of a conventional approach that concentrates on clock recovery by oversampling the bitstream is Phase ambiguity resolution for Manchester-encoded data, U.S. Pat. No. 5,224,126 to Myers et al. An example of a conventional system that focuses on edge detectors for clock recovery is Decoding method and Manchester decoder, U.S. Pat. No. 7,133,482 to Poletto et al. A conventional system that utilizes phase value correction according to signal strength and data recovery based on phase duration to do clock recovery is System and method for decoding Manchester data, U.S. Pat. No. 6,977,973 to Wiggins. Additional examples of convention systems are: U.S. Pat. No. 3,491,202 for Bi-Polar Phase Detector and Corrector for Split Phase PCM Data Signals to Bailey et al.; U.S. Pat. No. 4,733,404 for Apparatus and Method for Signal Processing to Ostoich; and U.S. Patent Publication No. US20030227987A1 for Decoding Method and Manchester Decoder to Poletto et al.

BRIEF SUMMARY OF THE INVENTION

In an embodiment of a Manchester decoder circuit, the circuit includes a first circuit node for receiving a preamble found signal, a second circuit node for receiving a data input signal, and a third circuit node for receiving a recovered clock signal. A first flip-flop is configured to store a phase of the data input signal responsive to the preamble found signal and the recovered clock signal and output the stored phase. A second flip-flop is configured to alternate state responsive to the preamble found signal and the recovered clock signal and output a decision time signal. A third flip-flop configured to store a switch pulse signal responsive to the recovered clock signal and the switch pulse signal and output the stored switch pulse signal. First combinational logic is configured to assert the switch pulse signal when the stored switch pulse signal is cleared, the decision time signal is active, and the stored phase of the data signal is the same logic value as a current phase of the data signal. A fourth flip-flop is configured to decode a decision pair of phases of the data input signal responsive to the recovered clock signal, the preamble found signal and the decision time signal and output a data output signal. Finally, second combinational logic is configured to select the stored phase and current phase of the data input signal as the decision pair when neither the switch pulse signal or stored switch pulse signal are asserted and to select the stored phase and an inverted stored phase as the decision pair when either the switch pulse signal or stored switch pulse signal are asserted. In a further refinement of this embodiment, the circuit further includes a shift register configured to shift and store the data output signal responsive to the decision time signal, invert a contents of the shift register responsive to the switch pulse signal, and assert a synchronization recognition signal when the contents of the shift register match a predetermined synchronization pattern.

An embodiment of a method for decoding a Manchester encoded data input signal includes receiving a preamble found signal, the data input signal, and a recovered clock signal. The method calls for storing a phase of the data input signal responsive to the preamble found signal and the recovered clock signal and generating a decision time signal that alternates state responsive to the recovered clock signal when the preamble found signal is asserted. The method also involves asserting a switch pulse signal when the decision time signal is active and the stored phase of the data signal is the same logic value as a current phase of the data signal as well as storing the switch pulse signal responsive to the recovered clock signal and clearing the switch pulse signal. The method further recites decoding a decision pair of phases of the data input signal responsive to the recovered clock signal, the preamble found signal and the decision time signal to generate a data output signal. Finally, the method calls for selecting the stored phase and current phase of the data input signal as the decision pair when neither the switch pulse signal or stored switch pulse signal are asserted and selecting the stored phase and an inverted stored phase as the decision pair when either the switch pulse signal or stored switch pulse signal are asserted. A further refinement of the method calls for serially storing the data output signal responsive to the decision time signal and inverting the serially stored data responsive to the switch pulse signal. In still a further refinement, the method calls for detecting when the serially stored data matches a predetermined synchronization pattern.

BRIEF DESCRIPTION OF THE DRAWINGS

An exemplary embodiment of a Manchester decoder is described below with reference to the following drawings, wherein:

FIGS. 2A-I are timing diagrams illustrating one example of the operation of the decoder of FIG. 1, wherein a decoding violation is detected and corrected; and FIGS. 3A-I are timing diagram illustrating another example of the operation of the decoder of FIG. 1, wherein no decoding violation occurs and no phase correction is required.

DETAILED DESCRIPTION OF THE INVENTION

Figure 1:
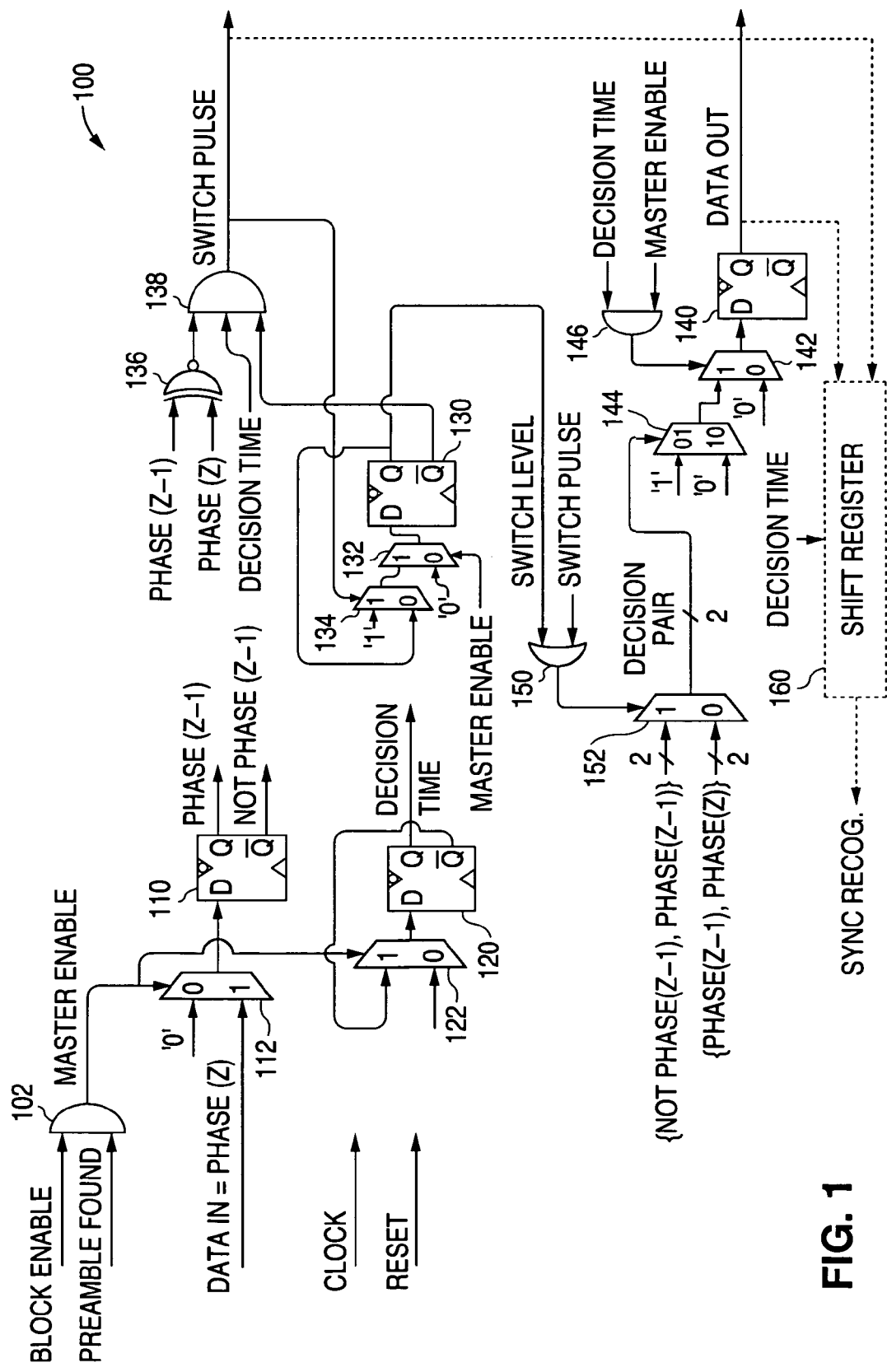
FIG. 1 is a logic circuit diagram illustrating an embodiment of a synchronous Manchester decoder.

In one embodiment, a circuit is provided for Manchester Leading Phase discovery and eventual bitstream retrieval correction. In another embodiment, the circuit is further configured to correct previous recovered data until the actual phase correction occurs. In this embodiment, the decoder is configured to perform backwards bitstream correction, i.e. history correction. In another embodiment, the circuit includes a Manchester Coding Violation warning mechanism that may be utilized by other parts of a receiver system. Further, an embodiment of a basic decoder in accordance with the present invention may be implemented using four flip-flops, though it relies on the bit clock rate being recovered elsewhere in the receiver, which reduces the size and current consumption of the circuitry.

Assuming a bit rate clock is provided to the decoder circuit, each two incoming bits may be regarded as a pair of Manchester phases of the encoded data. Leaving the declaration of preamble detection to be an event random in nature (meaning preamble can be found after a series of '1010' or '0101') and, therefore, the decoding process may begin in any of the Manchester phases, the decoder starts by determining the recovered data logic value based on pairs of sampled of '10' or '01' phase sequences.

The initial decoding pair consists of a previously sampled phase (z−1) and the current phase (z) coming into the decoder. A secondary decoding pair consists of a phase sampled two clocks ago (z−2) and the previous sampled phase (z−1). The decoder determines the value of the recovered data bit every two clock cycles, i.e. the decision time, based on the initial decoding pair. A shift register, which may be implemented elsewhere or incorporated into the decoder circuitry, stores the decoded data and looks for the sync word pattern. The shift register should be at least as long at the synch word pattern.

During the decoding process, if the initial decoding pair becomes either '00' or '11', it means that the decoder has detected the last phase of one data bit and the leading phase of the next following data bit. When this occurs, the decoder automatically declares a decoding violation situation and corrects the recovered bitstream by switching to the secondary decoding pair for further decoding. At the same time, the shift register inverts the bits stored prior to the detection of the decoding violation. The violation and pair switch occurs once during the decoding process of a packet and the entire system is re-initialized once the packet ends. Further pair violations found after the first violation and pair switch may be reported as Manchester code violations indicating the bit stream is wrongly coded or that there is an error on the reception or bit clock rate because properly Manchester encoded data should not yield a decoding pair correction more than once in a decoding session.

The preamble in Manchester coding is decoded into a series of all '1' or all '0' bits. The leading phase recovery and pair switch will occur in the sync word pattern, on the first bit that differs from the decoded bitstream. The monotonicity of the preamble decoding guarantees that if the decoder started decoding on the wrong pair, it will result in inversed polarity of the decoded data. Therefore, once the pair is switched, then the bits saved in the shift register need to be inverted. This property of the decoder places lower requirements on the sync word, which may then be reduced to requiring a single '1' and a '0' somewhere in the sync word pattern. This is predicated, of course, on the assumption that the receiver circuit has good reception and the decoder will not be required to detect the sync word in a noisy environment.

FIG. 1 is a logic circuit diagram illustrating an embodiment of a synchronous Manchester decoder 100. The decoder 100 of FIG. 1 receives clock, reset, data in, decoder enable and preamble found signals that are synchronized to the recovered bit clock rate. The decoder 100 outputs a decoded signal bitstream at a data out node and a phase shift correction indication signal at a switch pulse node.

Decoder 100 includes flip-flop 110 that operates to save PHASE (z−1) of the DATA IN signal. The term flip-flop is used to describe a single bit memory device or any similar device that operates to store a logic state. It is unnecessary to save the phase prior to PHASE (z−1) because that phase must be the opposite logic of PHASE (z−1) or a data input error would have been declared before reaching PHASE (z−1). The input of flip-flop 110 is coupled to an output of multiplexor 112, which selects between a '0' value input, which is the default state of flip-flop 110, and a DATA IN input that provides the PHASE (z) signal. Multiplexor 112 selects either the '0' logic input or the PHASE (z) input under the control of a MASTER ENABLE signal generated by AND logic gate 102, which logically combines the BLOCK ENABLE and PREAMBLE FOUND input signals provided to the decoder.

Flip-flop 120 asserts a DECISION TIME signal every two clock cycles. An inverted output of flip-flop 120 is fed back to the input of flip-flop 120 through multiplexor 122 under the control the MASTER ENABLE signal. An output of multiplexor 122 is coupled to the input of flip-flop 120 and selects between a default logic '0' value when the MASTER SIGNAL value is logic '0' and the inverted output of flip-flop 120 when the MASTER SIGNAL value is logic '1'.

Flip-flop 130 stores a SWITCH LEVEL signal that declares a permanent phase shift once the phase shift is declared. Multiplexor 132 determines the input to flip-flop 130 under control of the MASTER ENABLE signal in order set the default value of the flip-flop to logic '0'. Another multiplexor 134 selects between logic '1' and the non-inverting output of flip-flop 130 under the control of a SWITCH PULSE signal. The output of multiplexor 134 is fed through an input of multiplexor 132 so that the output of multiplexor 134 reaches the input of flip-flop 130 when the MASTER ENABLE signal is active.

The SWITCH PULSE signal is asserted when, during the decoding process, the initial decoding pair (PHASE(z−1), PHASE(z)) become either '00' or '11' at the decision time. If this condition is detected, then it indicates that the decision time is occurring on the last phase of a data bit and the leading phase of the following data bit, which is a decoding violation situation. The SWITCH PULSE signal is generated by combinational logic based on the PHASE (z), and PHASE (z−1) values, which are input to NOR gate 136 to detect a '00' or '11' pattern. The output of NOR gate 136 is combined with the DECISION TIME signal and the inverted value of SWITCH LEVEL from flip-flop 130 to assert the SWITCH PULSE signal at DECISION TIME when the '00' or '11' patterns are detected and SWITCH LEVEL is inactive. Because properly Manchester encoded data should not require a decoding pair correction more than once, the inverted value of SWITCH LEVEL from flip-flop 130 resets the SWITCH PULSE signal on the next clock cycle so that the decoder responds to the first decoding violation in a packet. Subsequent violations are preferably reported as Manchester code violations that indicate that the bit stream is incorrectly coded or that there is an error on the reception or bit clock rate.

As noted above, the decoder 100 determines the recovered data value based on pairs of sampled '10' or '01' series. When the decoding violation occurs, as indicated by the SWITCH PULSE signal being asserted, then the decoder 100 fixes the bitstream by switching and decoding based on the secondary decoding pair. The SWITCH LEVEL and SWITCH PULSE signals are input to OR gate 150 in order to control multiplexor 152 in selecting a DECISION PAIR. When either SWITCH LEVEL or SWITCH PULSE are active, multiplexor 152 selects the phase series (NOT PHASE (z−1), PHASE(z−1)) as the bit sequence that is output as the DECISION PAIR signal. When neither SWITCH LEVEL or SWITCH PULSE are active, multiplexor 152 selects the phase series (PHASE (z−1), PHASE(z)) as the bit sequence that is output as the DECISION PAIR signal. The DECISION PAIR signal, in turn, controls multiplexor 144 to selection between a logic '1', when DECISION PAIR is logic '01', and a logic '0' when DECISION PAIR is logic '10'. The output of multiplexor 144 is passed through multiplexor 142 to flip-flop 140, which generates the DATA OUT signal. Multiplexor 142 selects the output of multiplexor 144 when the DECISION TIME and MASTER ENABLE signals are both active as detected by AND gate 146. When either DECISION TIME or MASTER ENABLE are inactive, multiplexor 142 selects the default logic '0' value for input to flip-flop 140.

Multiplexor 144 converts the Manchester phase DECISION PAIR output from multiplexor 150 into a received bit for input to flip-flop 140. A '01' phase transition in the DECISION PAIR signal is decoded as a logical '1' and a '10' phase transition is decoded as a logical '0'. The decoded values is clock stored in flip-flop 140 on the next CLOCK signal cycle for output as DATA OUT to register 160, which is clocked by the DECISION TIME signal to shift and store the received bit stream.

Note that flip-flops 110, 120, 130 and 140 are clocked by a recovered bit clock signal CLOCK and reset by an externally provided RESET signal.

Shift register 160 preferably has at least as many bits as the synchronization pattern and includes logic for decoding the bits in the bit register to detect the synchronization pattern and assert the SYNC RECOG signal. Shift register 160, in this embodiment, is configured to receive the SWITCH PULSE signal and, when SWITCH PULSE is asserted, invert the bits stored in the shift register.

The implementation of decoder 100 will allow only one phase correction until entire receiver module is disabled or reset, which typically is done after the packet is fully received or ends in error. The embodiment of FIG. 1 may be modified to include circuitry for generating an indication for further phase pair violations in case the receiver system utilizes such information. Also, note that shift register 160 does not need to be dedicated to the decoder function. Register 160 may reside elsewhere in the receiver system allowing it to be reused for other functions, such as serial to parallel conversion of the recovered bitstream, in addition to synchronization pattern recognition.

FIGS. 2A-I are timing diagrams illustrating one example of the operation of decoder 100 of FIG. 1, wherein a decoding violation is detected and corrected. In this example, decoder 100 is searching for a synchronization pattern of 2D hex, which is binary 0010 1101. FIG. 2A indicates that the externally provided BLOCK ENABLE signal is asserted during the process. FIG. 2B is a waveform representing the recovered bit clock signal that is input to decoder 100. FIG. 2C illustrates the received DATA IN waveform that is being decoded. FIG. 2D represents the externally provided PREAMBLE FOUND signal, which is asserted to begin the decoding process as AND gate 102 combines the BLOCK ENABLE and PREAMBLE ENABLE to assert the MASTER ENABLE signal. FIG. 2E represents the DECISION TIME signal generated by flip-flop 120 once the MASTER ENABLE signal is asserted, which changes state every two bit clock cycles. FIG. 2F represents the Manchester phase pair decoded from the DATA IN signal, which is initially (PHASE (z−1), PHASE(z)) and where PHASE(z) is the current state of DATA IN and PHASE(z−1) is stored by flip-flop 110.

FIG. 2H represents the DATA OUT signal, which reflects the decoded value of the Manchester phase pair of FIG. 2F stored in flip-flop 140. FIG. 2I represents the hexadecimal value stored in shift register 160 as it serially stores and shifts the value of the DATA OUT signal.

FIG. 2G represents the SWITCH PULSE signal generated by logic gate 138 when a decoding violation situation is detected that requires a phase correction. At time $T_P$, the DATA IN produces two consecutive logic '0' bits, which are then reflected in the (PHASE(z−1), PHASE(z)) pair. This condition is detected by logic gate 136, which asserts the SWITCH PULSE signal, which also causes the SWITCH LEVEL signal to be asserted on the next cycle of the CLOCK signal. Assertion of the SWITCH PULSE signal causes shift register 160 to invert the received bits, which results in the contents of the register changing from '0F' hexadecimal to 'F0' hexadecimal.

While SWITCH PULSE is reset on the subsequent cycle of the CLOCK signal, SWITCH LEVEL will persist for another CLOCK signal cycle. The SWITCH PULSE and SWITCH LEVEL signals combine in logic gate 150 to drive multiplexor 152 for two cycles of the CLOCK signal, i.e. to the next cycle of the DECISION TIME signal, to select the secondary decision pair (NOT PHASE(z−1), PHASE(z−1)). The secondary decision pair then controls multiplexor 144 for purposes of translating the phase transitions into logic values for output through flip-flop 140. Thus, decoder 100 performs the phase correction.

In the example scenario of FIGS. 2A-I, the preamble detector signaled the beginning of the data at the wrong leading phase and asserted the PREAMBLE FOUND signal improperly. When decoder 100 detects the phase error, the bit previous to the error is corrected along with the remainder of the bitstream. In this case, the decoded Manchester data during the preamble should have been all zeroes, and the leading zeroes that are part of the first synchronization pattern nibble mingled with the preamble. When the SWITCH PULSE correction signal is asserted, shift register 160 automatically corrects the received bitstream by inverting its contents, as demonstrated in FIGS. 2G and 2I, wherein the SWITCH PULSE signal causes the contents of shift register 160 to change from hexadecimal '0F' to 'F0'. At the next decision time, shift register 160 shifts and stores the decoded data normally. The hexadecimal '2D' synchronization pattern, in this example, is detected and the packet will be properly received.

FIGS. 3A-I are timing diagram illustrating another example of the operation of decoder 100 of FIG. 1, wherein no decoding violation occurs and no phase correction is required. In this example, decoder 100 is again searching for a synchronization pattern of 2D hex, which is binary 0010 1101. FIG. 3A indicates that the externally provided BLOCK ENABLE signal is asserted during the process. FIG. 3B is a waveform representing the recovered bit clock signal that is input to decoder 100. FIG. 3C illustrates the received DATA IN waveform that is being decoded. FIG. 3D represents the externally provided PREAMBLE FOUND signal, which is asserted to begin the decoding process as AND gate 102 combines the BLOCK ENABLE and PREAMBLE ENABLE to assert the MASTER ENABLE signal. FIG. 3E represents the DECISION TIME signal generated by flip-flop 120 once the MASTER ENABLE signal is asserted, which changes state every two bit clock cycles. FIG. 3F represents the Manchester phase pair decoded from the DATA IN signal, which is initially (PHASE(z−1), PHASE(z)) and where PHASE(z) is the current state of DATA IN and PHASE(z−1) is stored by flip-flop 110.

FIG. 3H represents the DATA OUT signal, which reflects the decoded value of the Manchester phase pair of FIG. 3F stored in flip-flop 140. FIG. 3I represents the hexadecimal value stored in shift register 160 as it serially stores and shifts the value of the DATA OUT signal. FIG. 3G represents the SWITCH PULSE signal generated by logic gate 138 if a decoding violation situation is detected that requires a phase correction, which does not occur in this example.

In the example of FIGS. 3A-I, and in contrast to the event at $T_F$ in FIGS. 2A-I, the condition never arises that the DATA IN signal produces two consecutive logic '0' bits or logic '1' bits in the (PHASE(z−1), PHASE(z)) pair. The preamble detector signaled the beginning of the data by asserting the PREAMBLE FOUND signal at the proper leading phase. The packet will be received properly without any inversion or phase correction required.

Note that in the examples considered above, any combination of Manchester preamble ('1010' or '0101') is possible, and there are no restrictions as to where the preamble detection may be declared. Also not that it is relatively simple to implement a Manchester polarity inversion (e.g. decoding the pair '10' as a logic High, and the pair '01' as a logic Low). The only restriction for the synchronization pattern is that it must not be monotonic (i.e. it has to have at least one transition from logic High to Low, or vice-versa, somewhere in the pattern).

To improve performance under noisy conditions, a voting mechanism may be implemented wherein two or more phase violations are permitted in the decoding process and the decision phase pair is determined on the basis of a voting system. The characteristics of the voting system, such as the number of violations detected and the number of votes needed to decide in favor of each pair may be configured as desired for the particular application, which may result in, for example, a weighted voting or a fair voting system.

The decoder 100 has no dependencies on Manchester preamble polarity (i.e. sending a stream of all '1's or all '0's, Manchester coded into preamble as '0101' or '1010' respectively), no dependencies on where or when the decoding should start (i.e. preamble found indication), and the shift register provides an automatic means for self correcting the bitstream and finding the leading Manchester phase.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A Manchester decoder circuit, the circuit comprising:
    a first circuit node for receiving a preamble found signal, a second circuit node for receiving a data input signal, and a third circuit node for receiving a recovered clock signal;
    a first flip-flop configured to store a phase of the data input signal responsive to the preamble found signal and the recovered clock signal and output the stored phase;
    a second flip-flop configured to alternate state responsive to the preamble found signal and the recovered clock signal and output a decision time signal;
    a third flip-flop configured to store a switch pulse signal responsive to the recovered clock signal and the switch pulse signal and output the stored switch pulse signal;
    first combinational logic configured to assert the switch pulse signal when the stored switch pulse signal is cleared, the decision time signal is active, and the stored phase of the data signal is the same logic value as a current phase of the data signal;
    a fourth flip-flop configured to decode a decision pair of phases of the data input signal responsive to the recovered clock signal, the preamble found signal and the decision time signal and output a data output signal; and
    second combinational logic configured to select the stored phase and current phase of the data input signal as the decision pair when neither the switch pulse signal or stored switch pulse signal are asserted and to select the stored phase and an inverted stored phase as the decision pair when either the switch pulse signal or stored switch pulse signal are asserted.

2. The Manchester decoder circuit of claim 1, the circuit further including a shift register configured to shift and store the data output signal responsive to the decision time signal, invert a contents of the shift register responsive to the switch pulse signal, and assert a synchronization recognition signal when the contents of the shift register match a predetermined synchronization pattern.

3. The Manchester decoder circuit of claim 1, wherein the preamble signal is combined with a block enable signal to enable the decoder circuit.

4. The Manchester decoder circuit of claim 1, wherein:
    the first flip-flop is coupled to a first multiplexor that selects between a logic '0' and the data input signal for input to the first flip-flop responsive to the preamble found signal; and
    the second flip-flop is coupled to a second multiplexor that selected between a logic '0' and an inverting output of the second flip-flop for input to the first flip-flop responsive to the preamble found signal.

5. The Manchester decoder circuit of claim 1, wherein the first combinational logic further comprises:
an exclusive NOR gate having a first input coupled to the output of the first flip-flop, a second input coupled to the second circuit node; and an output; and
an AND gate having a first input coupled to the output of the exclusive NOR gate, a second input coupled to the output of the second flip-flop, a third input coupled to an inverting output of the third flip-flop, and an output for generating the switch pulse signal.

6. The Manchester decoder circuit of claim 1, wherein:
the circuit includes a third multiplexor that selects between a logic '1' and the output of the third flip-flop for output at an output terminal of the third multiplexor responsive to the switch pulse signal; and
the third flip-flop is coupled to a fourth multiplexor that selects between a logic '0' and the output terminal of the third multiplexor for input to the third flip-flop responsive to the preamble found signal.

7. The Manchester decoder circuit of claim 1, wherein:
the circuit includes a fifth multiplexor that selects between a logic '1' and a logic '0' for output at an output terminal of the fifth multiplexor responsive to the decision pair being a logic '01' and a logic '10'; and
the fourth flip-flop is coupled to a sixth multiplexor that selects between a logic '0' and the output terminal of the fifth multiplexor for input to the fourth flip-flop responsive to the preamble found signal and the decision time signal both being asserted.

8. The Manchester decoder circuit of claim 1, wherein the second combinational logic further comprises:
an OR gate having a first input coupled to the output of the third flip-flop, a second input configured to receive the switch pulse signal; and an output; and
a seventh multiplexor having a first set of inputs for receiving the stored phase and the current phase of the data input signal, a second set of inputs coupled to inverting and non-inverting outputs of the first flip-flop, and a set of output terminals for outputting the decision pair.

9. A method for decoding a Manchester encoded data input signal, the method comprising the steps of:
receiving a preamble found signal, the data input signal, and a recovered clock signal;
storing a phase of the data input signal responsive to the preamble found signal and the recovered clock signal;
generating a decision time signal that alternates state responsive to the recovered clock signal when the preamble found signal is asserted;
asserting a switch pulse signal when the decision time signal is active and the stored phase of the data signal is the same logic value as a current phase of the data signal;
storing the switch pulse signal responsive to the recovered clock signal and clearing the switch pulse signal;
decoding a decision pair of phases of the data input signal responsive to the recovered clock signal, the preamble found signal and the decision time signal to generate a data output signal; and
selecting the stored phase and current phase of the data input signal as the decision pair when neither the switch pulse signal or stored switch pulse signal are asserted and selecting the stored phase and an inverted stored phase as the decision pair when either the switch pulse signal or stored switch pulse signal are asserted.

10. The decoding method of claim 9, the method further including the steps of:
serially storing the data output signal responsive to the decision time signal; and
inverting the serially stored data responsive to the switch pulse signal.

11. The decoding method of claim 10, the method further including the step of detecting when the serially stored data matches a predetermined synchronization pattern.

12. A circuit for decoding Manchester encoded data, the circuit comprising:
means for receiving a preamble found signal, a data input signal, and a recovered clock signal;
means for storing a phase of the data input signal responsive to the preamble found signal and the recovered clock signal;
means for generating a decision time signal that alternates state responsive to the recovered clock signal when the preamble found signal is asserted;
means for asserting a switch pulse signal when the decision time signal is active and the stored phase of the data signal is the same logic value as a current phase of the data signal;
means for storing the switch pulse signal responsive to the recovered clock signal and clearing the switch pulse signal;
means for decoding a decision pair of phases of the data input signal responsive to the recovered clock signal, the preamble found signal and the decision time signal to generate a data output signal; and
means selecting the stored phase and current phase of the data input signal as the decision pair when neither the switch pulse signal or stored switch pulse signal are asserted and selecting the stored phase and an inverted stored phase as the decision pair when either the switch pulse signal or stored switch pulse signal are asserted.

13. The circuit of claim 12, the circuit further including:
means for serially storing the data output signal responsive to the decision time signal; and
means for inverting the serially stored data responsive to the switch pulse signal.

14. The circuit of claim 13, the circuit further including means for detecting when the serially stored data matches a predetermined synchronization pattern.

\* \* \* \* \*